(12) United States Patent
Sun et al.

(10) Patent No.: US 9,996,114 B2
(45) Date of Patent: Jun. 12, 2018

(54) PLASTIC FRAME, DISPLAY DEVICE AND ASSEMBLING METHOD THEREOF

(71) Applicants: BOE TECHNOLOGY GROUP CO., LTD., Beijing (CN); Beijing BOE Multimedia Technology Co., Ltd., Beijing (CN)

(72) Inventors: Yansheng Sun, Beijing (CN); Huijun Li, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

(*) Notice: Subject to any disclaimer, the term of this patent is extended or adjusted under 35 U.S.C. 154(b) by 0 days. days.

(21) Appl. No.: 14/906,424

(22) PCT Filed: Aug. 19, 2015

(86) PCT No.: PCT/CN2015/087507
§ 371 (c)(1),
(2) Date: Jan. 20, 2016

(87) PCT Pub. No.: WO2016/115886
PCT Pub. Date: Jul. 28, 2016

(65) Prior Publication Data
US 2016/0374213 A1    Dec. 22, 2016

(30) Foreign Application Priority Data

Jan. 19, 2015  (CN) .......................... 2015 1 0025654

(51) Int. Cl.
*G06F 1/16* (2006.01)
*G02F 1/1333* (2006.01)
(Continued)

(52) U.S. Cl.
CPC .......... *G06F 1/1637* (2013.01); *G06F 1/1601* (2013.01); *H05K 5/0017* (2013.01); *H05K 5/0204* (2013.01); *H05K 5/0234* (2013.01)

(58) Field of Classification Search
CPC ..... G06F 1/1656; G06F 1/1601; G06F 1/1637
(Continued)

(56) References Cited

U.S. PATENT DOCUMENTS 6,046,787 A * 4/2000 Nishiguchi ........ G02B 27/2214
348/E13.015
7,859,831 B2 * 12/2010 Nakanishi ................ H05K 5/02
345/156
(Continued)

FOREIGN PATENT DOCUMENTS

CN    1743909 A    3/2006
CN    101390405 A    3/2009
(Continued)

OTHER PUBLICATIONS

International Search Report dated Nov. 9, 2015 issued in corresponding International Application No. PCT/CN2015/087507 along with an English translation of the Written Opinion of the International Searching Authority.
(Continued)

*Primary Examiner* — Nidhi Thaker
(74) *Attorney, Agent, or Firm* — Nath, Goldberg & Meyer; Joshua B. Goldberg (57) ABSTRACT

Disclosed is a plastic frame, a display device and an assembling method thereof. The plastic frame includes: a limiting part, formed into a shape of rectangle and defining an area for fixing a display screen; and a supporting part, extending perpendicularly to the limiting part to support the display screen. The display screen includes a first panel and a second panel which is laminated to the first panel. The plastic frame
(Continued)

further includes a fixing unit arranged between the limiting part and the display screen, and a fixing surface of the fixing unit is in contact at least with a side surface of the first panel. The plastic frame according to the disclosure can more stably fix the display screen, thereby preventing damages of the display screen due to impacts on the plastic frame.

15 Claims, 3 Drawing Sheets

(51) Int. Cl.
  H05K 5/00 (2006.01)
  H05K 5/02 (2006.01)
(58) Field of Classification Search
  USPC .................. 361/679.24; 349/58–60, 15
  See application file for complete search history.

(56) References Cited

U.S. PATENT DOCUMENTS

| | | | | |
|---|---|---|---|---|
| 7,936,413 | B2* | 5/2011 | Jeong | H04N 5/645 349/58 |
| 8,441,784 | B2* | 5/2013 | Tang | H05K 5/0017 349/58 |
| 8,649,165 | B2* | 2/2014 | Lin | G06F 1/1637 248/917 |
| 8,811,004 | B2* | 8/2014 | Liu | F16B 2/22 349/58 |
| 2004/0141102 | A1* | 7/2004 | Lin | G02F 1/133308 349/58 |
| 2010/0147582 | A1* | 6/2010 | Shin | G02F 1/133308 174/535 |
| 2012/0154997 | A1* | 6/2012 | Shi | G06F 1/1656 361/679.01 |
| 2014/0285734 | A1* | 9/2014 | Lin | G06F 1/1643 349/12 |

FOREIGN PATENT DOCUMENTS

| | | | |
|---|---|---|---|
| CN | 201402358 Y | | 2/2010 |
| CN | 102096502 A | * | 6/2011 |
| CN | 203386162 U | | 1/2014 |
| CN | 204086745 U | | 1/2015 |
| CN | 104537956 A | | 4/2015 |
| EP | 0 596 545 A1 | | 5/1994 |
| EP | 0596545 A1 | | 5/1994 |
| JP | H11249113 A | | 9/1999 |
| TW | 201502590 A | | 1/2015 |
| WO | 2014194963 A1 | | 12/2014 |
| WO | WO 2014194963 A1 | * | 12/2014 ............. G02B 7/003 |

OTHER PUBLICATIONS

First Office Action dated Jul. 27, 2016 corresponding to Chinese application No. 201510025654.4.

* cited by examiner

PLASTIC FRAME, DISPLAY DEVICE AND ASSEMBLING METHOD THEREOF

This is a National Phase Application filed under 35 U.S.C. 371 as a national stage of PCT/CN2015/087507 filed on Aug. 19, 2015, an application claiming the benefit of Chinese Application No. 201510025654.4 filed on Jan. 19, 2015, the content of each of which is hereby incorporated by reference in its entirety.

FIELD OF THE INVENTION

The disclosure relates to the field of display technologies, and in particular to a plastic frame, a display device having the plastic frame and a method of assembling the display device.

BACKGROUND OF THE INVENTION

Figure 1:
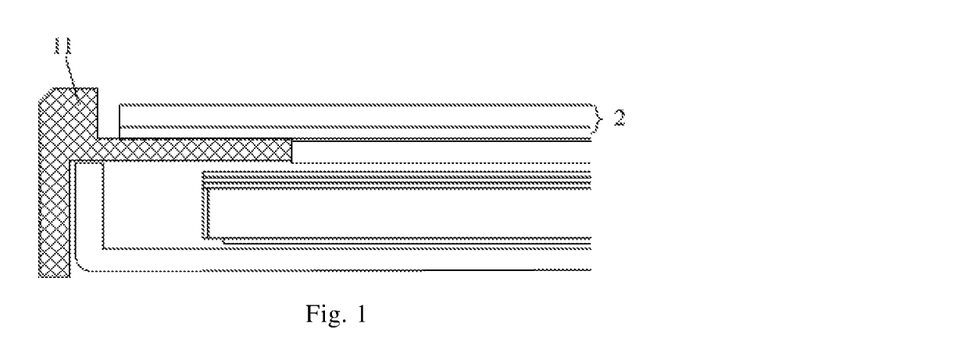
FIG. 1 is a schematic diagram of a structure of the display device in the prior art.
Figure 2:
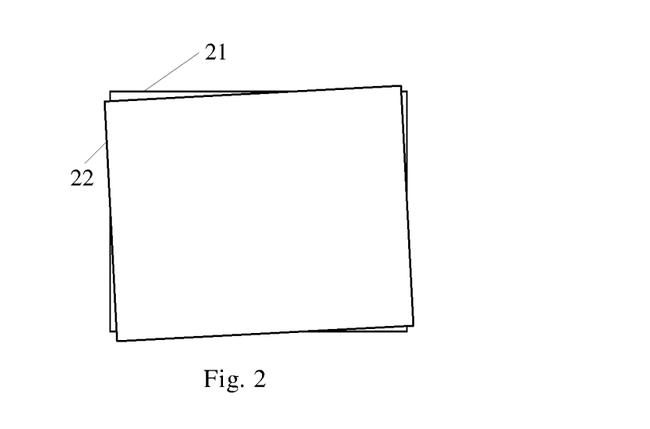
FIG. 2 is a schematic diagram when a relative deflection takes place between the raster panel and the display panel of the raster display device in the prior art.
Figure 3:
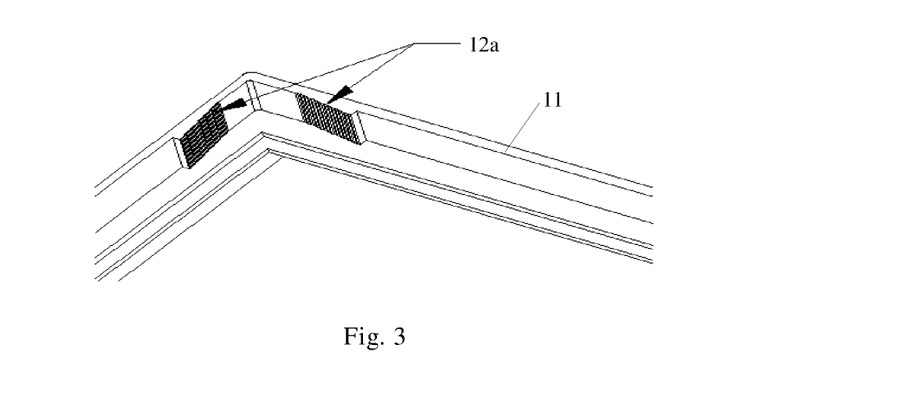
FIG. 3 is a schematic perspective view showing a structure of a plastic frame according to an embodiment of the disclosure.

At present, a display screen 2 of the display device is fixed by a limiting part 11 of a plastic frame (as shown in FIG. 1). A display screen of a raster naked-eye 3D is formed by fully laminating a raster panel 21 (which is constructed by laminating the raster on a substrate) on a common display panel 22. As shown in FIG. 2, however, in the process of lamination, a relative deflection between the raster panel 21 and the display panel 22 may occur due to a restriction of technique conditions, such that an included angle may be formed between an edge of the raster panel 21 (first panel) and an edge of the display panel 22 (second panel). As a result, a position where a line-contact takes place between the raster panel 21 and the limiting part 11 of the plastic frame may have a relatively small force bearing area and thus a relatively small impact resistance. Therefore, lamination effect of adhesives around the line-contact position may be deteriorated even by a relatively small impact. In addition, since there is a gap between the display screen 2 and the limiting part 11 of the plastic frame, when the display device is being assembled or transported, the raster panel 21 and the display panel 22 are easily displaced to impact the plastic frame, thereby influencing a display effect of the display screen.

SUMMARY OF THE INVENTION

An objective of this disclosure is to provide a plastic frame, a display device and an assembling method thereof to more stably fix the display screen.

In order to complete above objectives, according to the first aspect of the disclosure, there is provided a plastic frame, including: a limiting part, formed into a shape of rectangle and defining an area for fixing a display screen; and a supporting part, extending perpendicularly to the limiting part to support the display screen, the display screen including a first panel and a second panel which is laminated to the first panel, wherein the plastic frame further includes a fixing unit arranged between the limiting part and the display screen, and a fixing surface of the fixing unit is in contact at least with a side surface of the first panel.

Preferably, the first panel is arranged on a light emitting side of the display screen with respect to the second panel.

Preferably, the fixing unit includes a first wedge block, the first wedge block includes a bottom surface and an inclined surface, the bottom surface of the first wedge block is fixed to a side surface of the limiting part directing towards the display screen or formed integrally with the limiting part, and the inclined surface of the first wedge block is directed towards a side surface of the first panel.

Preferably, the fixing unit further includes a second wedge block, each of the first wedge block and the second wedge block is in a shape of triangle and includes a bottom surface and an inclined surface, and the inclined surface of the second wedge block is in contact with the inclined surface of the first wedge block, while the bottom surface of the second wedge block is in contact at least with the side surface of the first panel.

Preferably, each of the first wedge block and the second wedge block is in a shape of right triangle.

Preferably, a skid resistant layer is provided on the inclined surface of the first wedge block and/or the inclined surface of the second wedge block.

Preferably, the skid resistant layer includes a plurality of zigzag protrusions, and each of the inclined surface of the first wedge block and the inclined surface of the second wedge block is provided with the zigzag protrusions.

Preferably, opposite sides of the limiting part are provided with the fixing units.

According to the second aspect of the disclosure, there is also provided a display device, including a display screen and the plastic frame as described above.

Preferably, the display screen includes a first panel and a second panel laminated to the first panel, and the first panel is a raster panel, while the second panel is a display panel.

Preferably, the fixing unit includes a first wedge block, the first wedge block includes a bottom surface and an inclined surface, the bottom surface of the first wedge block is fixed to a side surface of the limiting part directing towards the display screen or formed integrally with the limiting part, and the inclined surface of the first wedge block is directed towards a side surface of the first panel.

Preferably, the fixing unit further includes a second wedge block, each of the first wedge block and the second wedge block is in a shape of triangle and includes a bottom surface and an inclined surface, and the inclined surface of the second wedge block is in contact with the inclined surface of the first wedge block, while the bottom surface of the second wedge block is in contact at least with the side surface of the first panel.

Preferably, the side surface of the second wedge block directing towards a light emitting direction of the display screen is flush with an outer surface of the first panel.

Preferably, the display screen includes a display region and a non-display region around the display region; the display device further includes a front frame for fixing the plastic frame and the display screen, a cross section of the front frame is formed in an L-shape and has an upright part and a folded part, and the upright part is arranged to surround a periphery of the plastic frame while the folded part is configured to cover the non-display region of the display screen; and adhesives are provided between the side surface of the second wedge block directing towards the folded part and the folded part.

According to the third aspect of the disclosure, there is also provided an assembling method of a display device, the assembling method including:

arranging a display screen in an area defined by a limiting part of a plastic frame and supporting it by a supporting part of the plastic frame, wherein the display screen includes a first panel and a second panel that is laminated to the first panel; and interposing a fixing unit into a clearance between the limiting part and the display screen, such that a fixing surface of the fixing unit is in contact at least with a side surface of the first panel.

Preferably, the fixing unit includes a first wedge block and a second wedge block, each of the first wedge block and the second wedge block is in a shape of triangle and includes a bottom surface and an inclined surface, the bottom surface of the first wedge block is fixed to a side surface of the limiting part directing towards the display screen or formed integrally with the limiting part, the step of interposing the fixing unit into the clearance between the limiting part and the display screen further includes:

in the case that the inclined surface of the second wedge block faces to the inclined surface of the first wedge block, interposing the second wedge block into a clearance between the first wedge block and the display screen, such that the inclined surface of the second wedge block is in contact with the inclined surface of the first wedge block while the bottom surface of the second wedge block is in contact at least with the side surface of the first panel of the display screen.

Preferably, after the step of interposing the second wedge block into the clearance between the first wedge block and the display screen, the assembling method further includes:

mounting a front frame around the plastic frame in an adhesive manner, wherein a cross section of the front frame is formed in an L-shape and has an upright part and a folded part, the upright part being arranged to surround a periphery of the plastic frame while the folded part being configured to cover a non-display region of the display screen.

In the disclosure, the fixing unit is arranged in the clearance between the display screen and the limiting part, such that the display screen can be kept stable with respect to the plastic frame. Therefore, when the display device is transported or assembled, the display screen can be kept immobile with respect to the plastic frame, thereby decreasing impacts on the display screen and in turn reducing damages of the lamination between the first panel and the second panel. Therefore, in comparison with the prior art, it is possible to better protect the display screen.

BRIEF DESCRIPTION OF THE DRAWINGS

Accompanying drawings are provided for further understanding of this disclosure and constituting a part of the specification. Hereinafter, these drawings are intended to explain the disclosure together with the following specific embodiments, but should not be considered as a limitation of the disclosure. In which.

DETAILED DESCRIPTION OF THE EMBODIMENTS

Hereinafter, specific embodiments of the disclosure will be described in detail in conjunction with the accompanying drawings. It should be understood that the specific embodiments as set forth herein are merely for the purpose of illustration and explanation of the disclosure and should not be constructed as a limitation thereof.

As a first aspect of the disclosure, there is provided a plastic frame. As shown in FIGS. 3-6, the plastic frame may include a limiting part 11 and a supporting part 13. The limiting part 11 is formed into a shape of rectangle and defines an area for fixing a display screen 2. The supporting part 13 extends perpendicularly to the limiting part 11 to support the display screen 2. The display screen 2 may include a first panel (for example, a raster panel) 21 and a second panel (for example, a display panel) 22 which is laminated to the first panel 21. According to the disclosure, the plastic frame may further include a fixing unit 12 arranged between the limiting part 11 and the display screen 2, and a fixing surface of the fixing unit is in contact at least with a side surface of the first panel 21.

In order to prevent the deflected first panel 21 from touching the limiting part 11 to damage the limiting part or the first panel itself, the area defined by the limiting part 11 has somewhat tolerance with respect to the display device comprising the first panel and the second panel. In particular, the area defined by the limiting part 11 is slightly larger than an area of the display screen 2. After the assembly of the display screen 2 with plastic frame, a clearance normally remains between an inside surface of the limiting part 11 and the display screen 2. Since the first panel may be misplaced (relatively deflected) with respect to the second panel, however, the display screen 2 may be displaced within the area defined by the limiting part 11 to impact the limiting part 11 when the display device is transported. Therefore, the plastic frame according to the disclosure may include the fixing unit 12 arranged between the display screen 2 and the limiting part 11. The fixing unit 12 is able to contact the side surface of the display screen 2, such that the display screen 2 is immovable with respect to the plastic frame. Therefore, when the display device is moved or assembled, the display screen 2 is kept immovable with respect to the plastic frame, such that the impacts of the display screen 2 on the limiting part 11 may be reduced. Since the impacts of the display screen 2 on the limiting part 11 are reduced, it is possible to reduce the influence of the impacts on the adhesives between the first panel and the second panel so as to improve the display effect.

When the display screen 2 is mounted in the area defined by the limiting part 11, the fixing unit 12 may be interposed between the limiting part 11 and the display screen 2, such that the display screen 2 is kept immovable with respect to the plastic frame. When the entire display device is subjected to a large impact, since the display screen 2 is kept immobile with respect to the plastic frame, a possibility of damage to the display screen 2 may be reduced.

Arrangements of the first panel 21 and the second panel 22 are not limited by the disclosure. In particular, the first panel 21 may be arranged on or under the second panel 22. Description will be given, for example, by the arrangement of the first panel 21 on a light emitting side of the display screen 2 with respect to the second panel 22 (i.e., arrangement of the first panel 21 on the second panel 22). The term "on" used herein refers to an upper direction in FIG. 9. The fixing surface of the fixing unit 12 is in contact at least with the side surface of the first panel 21. In other words, it can be in contact only with the side surface of the first panel 21 or it can be in contact with both the first panel 21 and the second panel 22. Thus, even if the first panel 21 of the display screen 2 is unaligned with the second panel 22 at edges thereof during the lamination, the first panel 21 may be kept immovable by the fixing unit 12. As such, the purpose of fixing the entire display screen 2 can be reached by fixing the first panel 21.

As an example of the disclosure, the fixing unit 12 may include a first wedge block 12a. The first wedge block 12a has a bottom surface and an inclined surface. The bottom surface of the first wedge block 12a is fixed to a side surface of the limiting part 11 directing towards the display screen 2 or formed integrally with the limiting part 11. The inclined surface of the first wedge block 12a is directed towards a side surface of the first panel.

Figure 4:
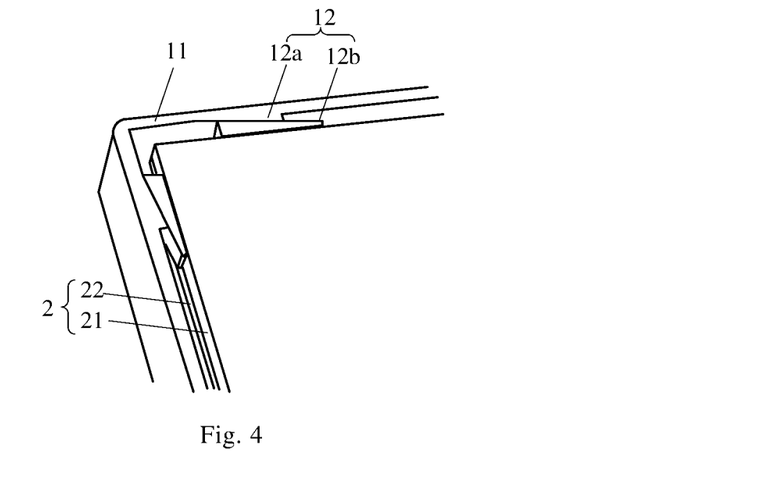
FIG. 4 is a schematic perspective view when the display screen is fixed by a fixing unit of the plastic frame according to the embodiment of the disclosure.
Figure 5:
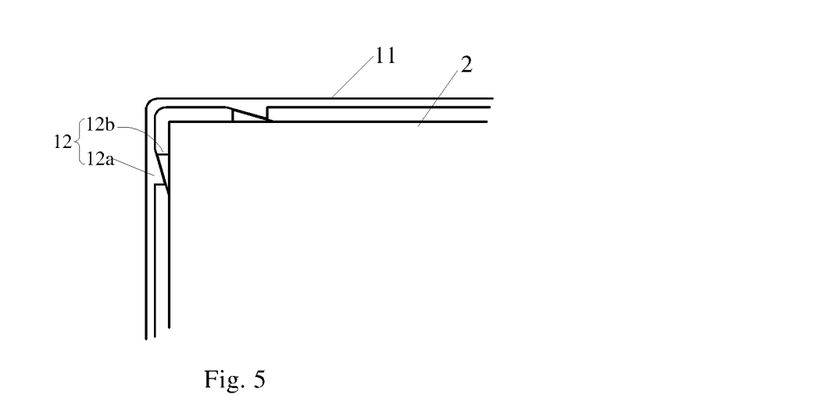
FIG. 5 is a plan view of the plastic frame as shown in FIG. 4.
Figure 6:
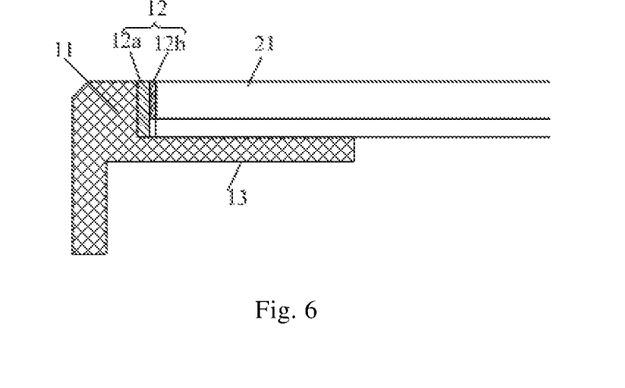
FIG. 6 is a cross-section view of the plastic frame as shown in FIG. 5.
Figure 7:
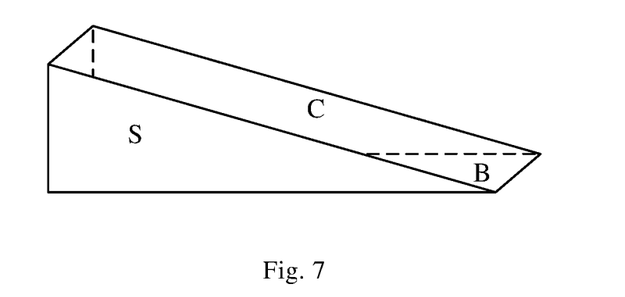
FIG. 7 is a schematic perspective view of a structure of a first wedge block or a second wedge block according to the embodiment of the disclosure.

As a preferred example of the disclosure, as shown in FIGS. 4 and 5, the fixing unit 12 may further include a second wedge block 12b. Each of the first wedge block 12a and the second wedge block 12b is in a shape of triangle. In this case, as shown in FIG. 7, each of the first wedge block 12a and the second wedge block 12b includes a bottom surface B, an inclined surface C and two opposite side surfaces S. As stated above, the bottom surface B of the first wedge block 12a is fixed to the side surface of the limiting part 11 directing towards the display screen 2; or as an alternative, the first wedge block 12a is formed integrally with the limiting part 11. The inclined surface C of the second wedge block 12b is used to contact the inclined surface C of the first wedge block 12a, and the bottom surface of the second wedge block 12b is used to contact at least the side surface of the first panel 21 (surface contact). In the example of the disclosure, each of the first wedge block 12a and the second wedge block 12b is in a shape of right triangle. However, the disclosure is not limited thereto. It is readily understood by those skilled in the art that the first wedge block 12a and the second wedge block 12b may have any suitable shapes.

In the disclosure, the first wedge block 12a is fixed to the limiting part 11 or formed integrally with the limiting part 11, while the second wedge block 12b may be freely movable. In other words, before the display device is assembled, the second wedge block 12b is separate from the first wedge block 12a. Therefore, the second wedge block 12b is arranged between the inclined surface of the first wedge block 12a and the first panel 21 in an adjustable manner.

The included angle between the bottom surface B of the first wedge block 12a and the inclined surface C and the included angle between the bottom surface B of the second wedge block 12b and the inclined surface C are not limited by the disclosure. However, the included angle between the bottom surface B of the first wedge block 12a and its inclined surface C is preferably configured to be equal to the included angle between the bottom surface B of the second wedge block 12b and its inclined surface C. In this case, when the inclined surface C of the second wedge block 12b is in contact with the inclined surface C of the first wedge block 12a, the bottom surface B of the second wedge block 12b is parallel to the bottom surface B of the first wedge block 12a. In this manner, the fixing unit 12 can be adapted to the clearance between the limiting part 11 and the display screen 2, and a maximum contact area of the display screen 2 with the limiting part 11 via the fixing unit 12 can be achieved. Therefore, the display screen 2 can be stably mounted within the area defined by the limiting part 11, reducing the possibility of the damage of the display screen 2. In addition, when the display screen 2 (inclusive of the first panel 21 and the second panel 22) is mounted in the limiting part 11, an outer surface of the display screen 2 is flush with the side surface S of the fixing unit 12 and a side surface of the limiting part 11.

Preferably, a skid resistant layer 14 can be provided on the inclined surface C of the first wedge block 12a and/or the inclined surface C of the second wedge block 12b to prevent the second wedge block 12b from sliding with respect to the first wedge block 12a. The skid resistant layer 14 may include a plurality of zigzag protrusions.

Figure 8:
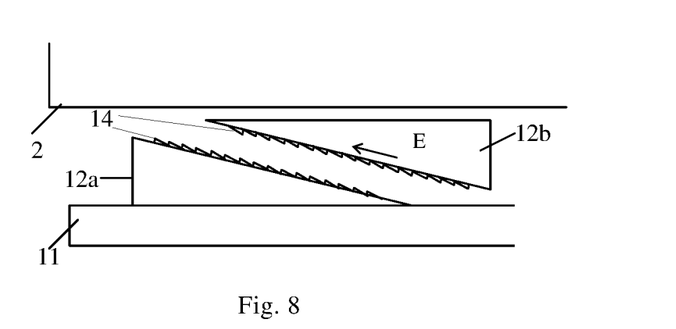
FIG. 8 is a diagram showing a cooperation of the first wedge block and the second wedge block according to the embodiment of the disclosure.

As shown is FIG. 8, preferably, each of the inclined surface C of the first wedge block 12a and the inclined surface C of the second wedge block 12b is provided with the zigzag protrusions. A cross section of the zigzag protrusion is formed into a triangular shape. When the first wedge block 12a and the second wedge block 12b are in a condition as shown in FIG. 8, tips of the zigzag protrusions on the inclined surface C of the first wedge block 12a are arranged in a direction as indicated by an arrow E, while tips of the zigzag protrusions on the inclined surface C of the second wedge block 12b are arranged in a direction opposite to the arrow E. In such an arrangement, when the second wedge block 12b is inserted (wedged) into the clearance between the first wedge block 12a and the display screen 2 along the direction as indicated by the arrow E, the zigzag protrusions may not interfere with moving the second wedge block 12b in an insert direction (the direction as indicated by the arrow E); and when the second wedge block 12b is moved into an appropriate position in the insert direction (the direction as indicated by the arrow E), the zigzag protrusions can prevent the second wedge block 12b from sliding with respect to the first wedge block 12a.

In order to improve stability for fixing the display screen, opposite sides of the rectangular limiting part 11 may be provided with the fixing units 12. Preferably, each side of the rectangular limiting part 11 is provided with the fixing unit 12.

In the disclosure, when the fixing unit 12 includes the first wedge block 12a and the second wedge block 12b, the first wedge block 12a and the second wedge block 12b are connected in a detachable manner. In other words, before the display is assembled, the first wedge block 12a is separate from the second wedge block 12b; after the display device is assembled, the second wedge block 12b is inserted (wedged) into the clearance between the first wedge block 12a and the display screen 2 in such a manner that the first wedge block 12a cooperates with the second wedge block 12b. In practice, of course, the first wedge block 12a and the second wedge block 12b are also provided to the plastic frame in advance before the assembly of the display device. As another aspect of the disclosure, there is provided a display device. The display device may include a display screen 2 and plastic frame as explained above. The display screen 2 is mounted within an area defined by a limiting part 11 of the plastic frame and supported by a supporting part 13 of the plastic frame. The display screen 2 includes a first panel 21 and a second panel 22 which is arranged under and laminated to the first panel 21. A fixing surface of a fixing unit 12 is in contact at least with the first panel 21.

Structures of the display screen are not limited by the disclosure. For example, the display screen could be a touch display screen; in this case, the display screen may include a touch cover sheet and a display panel accordingly. As a specific embodiment of the disclosure, the display screen 2 could be a raster display screen; in this case, the display screen 2 may include a raster panel (including a substrate and raster arranged on the substrate) and a display panel (including an array substrate and a cell substrate) accordingly.

When the display screen 2 includes the raster panel and the display panel, the display panel usually is a thinner and has a lower rigidity, while the raster panel is thicker and has a higher rigidity. In order to improve the stability for fixing the display screen, preferably, the first panel is a raster panel and the second panel is a display panel. When the raster panel is deflected with respect to the display panel, the fixing unit 12 can be interposed between a side surface of the raster panel and a side surface of the limiting part. In such a manner, it is possible to increase a contact area of the side surface of the raster panel with the side surface of the limiting part via the fixing unit 12, so as to fix the display screen 2.

As described above, the fixing unit 12 may include the first wedge block 12a and the second wedge block 12b. As an example, each of the first wedge block 12a and the second wedge block 12b has a shape of triangle. In this case, as shown in FIG. 7, each of the first wedge block 12a and the second wedge block 12b includes the bottom surface B, the inclined surface C and two opposite side surfaces S. The included angle between the bottom surface B of the first wedge block 12a and its inclined surface C is equal to the included angle between the bottom surface B of the second wedge block and its inclined surface C. The bottom surface B of the first wedge block 12a is fixed to a side surface of the limiting part 11 directing towards the display screen or formed integrally with the limiting part 11. The inclined surface C of the second wedge block 12b is in contact with the inclined surface C of the first wedge block 12a, while the bottom surface B of the second wedge block 12b is in contact with a side surface of the first panel. In such a manner, it is possible to better control a wedged amount of the second wedge block 12b on the basis of the display screen.

Further, the side surface S of the second wedge block 12b directing towards a light emitting direction of the display screen 2 is flush with an outer surface of the first panel 21.

Figure 9:
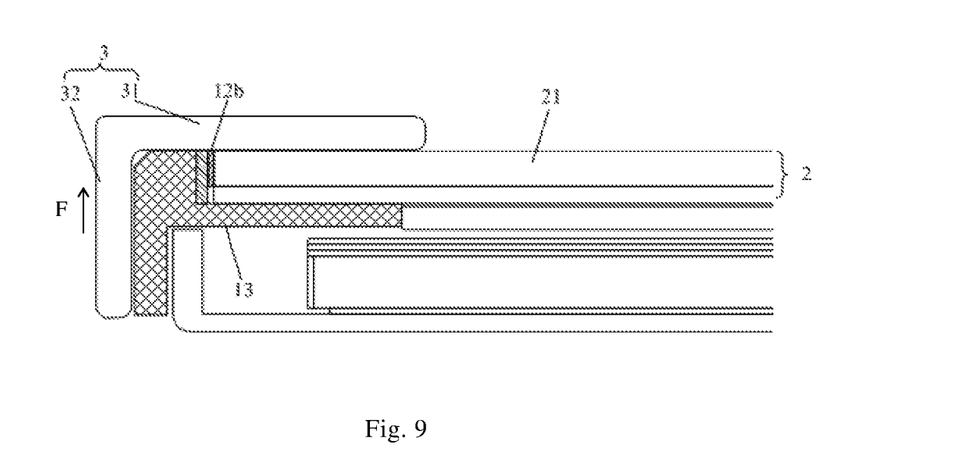
FIG. 9 is a schematic diagram of a display device in which the plastic frame according to the embodiment of the disclosure is used.

Further, the display screen 2 includes a display region and a non-display region around the display region. As shown in FIG. 9, the display device may further include a front frame 3. In the cross section as shown in FIG. 9, the front frame 3 is formed in an L-shape and has an upright part 32 and a folded part 31. The upright part 32 is arranged to surround a periphery of the plastic frame while the folded part 31 is configured to cover the non-display region of the display screen, in order to fix the display screen 2 in a direction as indicated by an arrow F in FIG. 9. Adhesives may be provided between the side surface S of the second wedge block 12b directing towards the folded part 31 and the folded part 31. The adhesion action of the adhesives can prevent the second wedge block 12b from moving in a depth direction of the plastic frame, thereby improving the stability of the display screen 2.

As a third aspect of the disclosure, there is provided an assembling method of a display device, the assembling method including:

arranging a display screen in an area defined by a limiting part of a plastic frame and supporting it by a supporting part of the plastic frame, wherein the display screen includes a first panel and a second panel that is laminated to the first panel; and interposing a fixing unit into a clearance between the limiting part and the display screen, such that a fixing surface of the fixing unit is in contact at least with a side surface of the first panel (surface contact).

As described above, the fixing unit may include a first wedge block and a second wedge block. Each of the first wedge block and the second wedge block includes a bottom surface and an inclined surface. The bottom surface of the first wedge block is fixed to the side surface of the limiting part 11 directing towards the display screen or formed integrally with the limiting part. Therefore, the step of interposing the fixing unit into the clearance between the limiting part and the display screen may further include:

in the case that the inclined surface of the second wedge block faces to the inclined surface of the first wedge block, interposing the second wedge block into a clearance between the first wedge block and the display screen, such that the inclined surface of the second wedge block is in contact with the inclined surface of the first wedge block while the bottom surface of the second wedge block is in contact at least with the side surface of the first panel of the display screen (surface contact).

A plurality of fixing units may be provided to the limiting part 11 of the plastic frame to fix the display screen in multiple directions.

Further, after the step of interposing the second wedge block into the clearance between the first wedge block and the display screen, the assembling method may further include:

mounting the front frame around the plastic frame in an adhesive manner, wherein a cross section of the front frame is formed in an L-shape and has an upright part and a folded part, the upright part being arranged to surround a periphery of the plastic frame while the folded part being configured to cover a non-display region of the display screen. In such a manner, the second wedge block is kept immovable with respect to the plastic frame by the front frame, thereby improving the stability of the display screen.

It should be explained, the term "contact" used herein may be constructed as a tight contact to a relatively immobile degree. For example, lamination (such as, physical lamination, chemical lamination and natural lamination) contact and frictional contact may be employed, which are not limited herein.

The plastic frame, the display device and the assembling method thereof have been described above. As stated, the plastic frame includes the fixing unit for fixing the display screen, and the fixing unit is arranged in the clearance between the display screen and the limiting part of the plastic frame. Therefore, when the display device is transported, the display screen can be kept immobile with respect to the plastic frame, thereby decreasing impacts on the display screen and in turn reducing damages of the lamination between the first panel and the second panel.

It should be understood that the above implementations are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

The invention claimed is:

1. A plastic frame, including:
   a limiting part, formed into a shape of rectangle and defining an area for fixing a display screen; and
   a supporting part, extending perpendicularly to the limiting part to support the display screen,
   the display screen including a first panel and a second panel which is laminated to the first panel, wherein the first panel is a raster panel and the second panel is a display panel,
   the plastic frame further includes a fixing unit arranged between the limiting part and the display screen, and a fixing surface of the fixing unit is in contact with side surfaces of the first panel and the second panel, wherein
   the fixing unit includes a first wedge block and a second wedge block, each of the first wedge block and the second wedge block being formed in a triangle shape having a bottom surface and an inclined surface,
   the inclined surface of the second wedge block is able to be in contact with the inclined surface of the first wedge block,
   a plurality of zigzag protrusions are provided on the inclined surface of the first wedge block and the inclined surface of the second wedge block, tips of the zigzag protrusions on the inclined surface of the first wedge block being arranged in an insert direction of the second wedge block, while tips of the zigzag protrusions on the inclined surface of the second wedge block being arranged in a direction opposite to the insert direction, and
   when the second wedge block is inserted into a clearance between the first wedge block and the display screen along the insert direction, the zigzag protrusions are not able to interfere with the movement of the second wedge block along the insert direction; and when the second wedge block is seated, the zigzag protrusions are able to prevent the second wedge block from sliding with respect to the first wedge block.

2. The plastic frame according to claim 1, wherein the first panel is arranged on a light emitting side of the display screen with respect to the second panel.

3. The plastic frame according to claim 1, wherein the bottom surface of the first wedge block is fixed to a side surface of the limiting part directing towards the display screen or formed integrally with the limiting part, and the inclined surface of the first wedge block is directed towards a side surface of the first panel.

4. The plastic frame according to claim 3, wherein the inclined surface of the second wedge block is in contact with the inclined surface of the first wedge block, while the bottom surface of the second wedge block is in contact at least with the side surface of the first panel.

5. The plastic frame according to claim 4, wherein each of the first wedge block and the second wedge block is in a right triangle shape.

6. The plastic frame according to claim 3, wherein opposite sides of the limiting part are provided with the fixing units.

7. A display device, wherein the display device includes the plastic frame according to claim 1.

8. The display device according to claim 7, wherein the bottom surface of the first wedge block is fixed to a side surface of the limiting part directing towards the display screen or formed integrally with the limiting part, and the inclined surface of the first wedge block is directed towards a side surface of the first panel.

9. The display device according to claim 8, wherein the inclined surface of the second wedge block is in contact with the inclined surface of the first wedge block, while the bottom surface of the second wedge block is in contact at least with the side surface of the first panel.

10. The display device according to claim 9, wherein each of the first wedge block and the second wedge block is in a right triangle shape.

11. The display device according to claim 9, wherein the side surface of the second wedge block directing towards a light emitting direction of the display screen is flush with an outer surface of the first panel.

12. The display device according to claim 9, wherein the display screen includes a display region and a non-display region around the display region;
    the display device further includes a front frame for fixing the plastic frame and the display screen, a cross section of the front frame is formed in an L-shape and has an upright part and a folded part, and the upright part is arranged to surround a periphery of the plastic frame while the folded part is configured to cover the non-display region of the display screen; and
    adhesives are provided between the side surface of the second wedge block directing towards the folded part and the folded part.

13. An assembling method of a display device, wherein the assembling method includes:
    arranging a display screen in an area defined by a limiting part of a plastic frame and supporting it by a supporting part of the plastic frame, wherein the display screen includes a first panel and a second panel that is laminated to the first panel, the first panel being a raster panel and the second panel being a display panel; and
    interposing a fixing unit into a clearance between the limiting part and the display screen, such that a fixing surface of the fixing unit is in contact with side surfaces of the first panel and the second panel, wherein
    the fixing unit includes a first wedge block and a second wedge block, each of the first wedge block and the second wedge block being formed in a triangle shape having a bottom surface and an inclined surface,
    the inclined surface of the second wedge block is able to be in contact with the inclined surface of the first wedge block,
    a plurality of zigzag protrusions are provided on the inclined surface of the first wedge block and the inclined surface of the second wedge block, tips of the zigzag protrusions on the inclined surface of the first wedge block being arranged in an insert direction of the second wedge block, while tips of the zigzag protrusions on the inclined surface of the second wedge block being arranged in a direction opposite to the insert direction, and
    when the second wedge block is inserted into a clearance between the first wedge block and the display screen along the insert direction, the zigzag protrusions are not able to interfere with the movement of the second wedge block along the insert direction; and when the second wedge block is seated, the zigzag protrusions are able to prevent the second wedge block from sliding with respect to the first wedge block.

14. The assembling method according to claim 13, wherein the bottom surface of the first wedge block is fixed to a side surface of the limiting part directing towards the display screen or formed integrally with the limiting part, the step of interposing the fixing unit into the clearance between the limiting part and the display screen further includes:

in the case that the inclined surface of the second wedge block faces to the inclined surface of the first wedge block, interposing the second wedge block into a clearance between the first wedge block and the display screen, such that the inclined surface of the second wedge block is in contact with the inclined surface of the first wedge block while the bottom surface of the second wedge block is in contact at least with the side surface of the first panel of the display screen.

15. The assembling method according to claim 14, wherein after the step of interposing the second wedge block into the clearance between the first wedge block and the display screen, the assembling method further includes:

mounting a front frame around the plastic frame in an adhesive manner, wherein a cross section of the front frame is formed in an L-shape and has an upright part and a folded part, the upright part being arranged to surround a periphery of the plastic frame while the folded part being configured to cover a non-display region of the display screen.

* * * * *